(12) United States Patent
Jain

(10) Patent No.: US 12,170,108 B2
(45) Date of Patent: *Dec. 17, 2024

(54) CIRCUITRY FOR POWER MANAGEMENT ASSERTION

(71) Applicant: Taiwan Semiconductor Manufacturing Company, Ltd., Hsinchu (TW)

(72) Inventor: Sanjeev Kumar Jain, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/325,170

(22) Filed: May 30, 2023

(65) Prior Publication Data

US 2023/0298662 A1 Sep. 21, 2023

Related U.S. Application Data

(63) Continuation of application No. 17/468,771, filed on Sep. 8, 2021, now Pat. No. 11,670,365.

(60) Provisional application No. 63/175,197, filed on Apr. 15, 2021.

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/418; G11C 11/419
USPC ....................................................... 365/154
See application file for complete search history.

(56) References Cited

U.S. PATENT DOCUMENTS

| | | | |
|---|---|---|---|
| 6,097,635 A * | 8/2000 | Chang | G11C 16/26 365/185.21 |
| 6,181,640 B1 * | 1/2001 | Kang | G11C 11/419 365/233.5 |
| 6,288,959 B1 | 9/2001 | OuYang et al. | |
| 10,916,275 B1 | 2/2021 | Ghosh et al. | |
| 2008/0298142 A1 * | 12/2008 | Chen | G11C 11/419 365/194 |
| 2009/0040846 A1 | 2/2009 | Chang | |

(Continued)

FOREIGN PATENT DOCUMENTS

| | | |
|---|---|---|
| CN | 103871474 A | 6/2014 |
| CN | 104813404 A | 7/2015 |

OTHER PUBLICATIONS

Taiwanese Office Action; Application No. 111102703; Dated Jul. 28, 2022.

*Primary Examiner* — Sung Il Cho
(74) *Attorney, Agent, or Firm* — Jones Day

(57) ABSTRACT

Circuits and methods are described herein for controlling a bit line precharge circuit. For example, a control circuit includes a first latch circuit and a second latch circuit. The first latch circuit is configured to receive a first light sleep signal. The first latch circuit generates a second light sleep signal according to a clock signal. The second latch circuit is configured to receive the second light sleep signal. The second latch circuit generates a third light sleep signal according to a sense amplifier enable signal. The second latch circuit provides the third light sleep signal to a bit line reading switch, so the bit line reading switch is cutoff after a sense amplifier is enabled.

20 Claims, 11 Drawing Sheets

(56) References Cited

U.S. PATENT DOCUMENTS

| | | | |
|---|---|---|---|
| 2012/0134225 A1* | 5/2012 | Chow | G11C 7/08 |
| | | | 365/205 |
| 2013/0135940 A1 | 5/2013 | Mori et al. | |
| 2015/0248923 A1* | 9/2015 | Lin | G11C 7/08 |
| | | | 365/191 |
| 2018/0238965 A1 | 8/2018 | Anzou et al. | |
| 2021/0304816 A1 | 9/2021 | Gupta et al. | |
| 2022/0215872 A1* | 7/2022 | Raj | H10B 10/12 |

* cited by examiner

CIRCUITRY FOR POWER MANAGEMENT ASSERTION

PRIORITY CLAIM

The present application is a continuation of U.S. patent application Ser. No. 17/468,771, filed Sep. 8, 2021, which claims priority to U.S. Application 63/175,197, filed Apr. 15, 2021, the contents of each of which is incorporated by reference herein in their entirety.

FIELD

The technology described in this disclosure relates generally to circuitry for power management assertion.

BACKGROUND

Static random access memory (SRAM) is a type of semiconductor memory that uses bi-stable latching circuitry to store each bit in a memory array. SRAM maintains data in the memory array without the need to be refreshed when powered, but is still volatile such that data is eventually lost when the memory is not powered. Power gating and voltage retention techniques are commonly implemented to the memory array to reduce power consumption. For example, power gates may be used to turn off memory periphery items in a deep sleep mode, and both the periphery items and the memory array in a shutdown mode. When the memory comes out of the shutdown mode, power gates are used to ramp up the internal supply voltage of the memory. This can result in a large wake up inrush current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
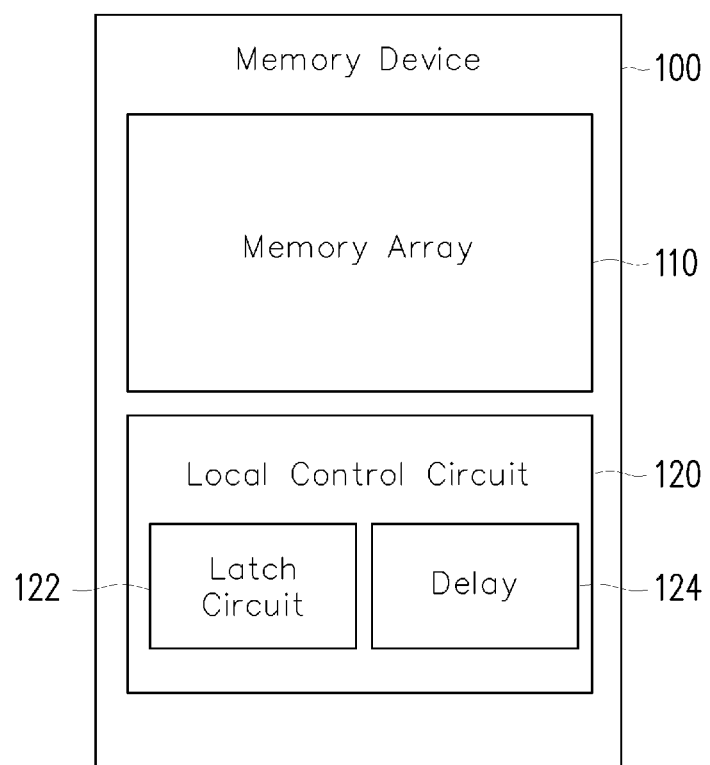
FIG. 1 is a block diagram illustrating an example memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Electrical circuits often are made up of various sub-components, each tasked with a specific set of functions. Some of those functions may not be applicable to all modes of circuit operation. Sub-components of a circuit may be selectively activated or deactivated based on a current or future state of the circuit (e.g., a desired next state of the circuit). By deactivating sub-components, certain power savings may be achieved.

As demands for circuit speed performance increase, the tolerance for circuit operation lag to facilitate sub-component activation/deactivation diminishes. A circuit may be designed to begin activating/deactivating components in anticipation of a next operation cycle while a current operation cycle is still ongoing. But speed performance gains that might be realized by aggressive power management may be undesirable if such power management has an adverse effect on operations in a current operation cycle.

Circuits and methods as described herein provide power management control circuitry that ensures that power management control states for a next operation cycle does not impair circuit operation in the current operation cycle. In an embodiment, certain latching circuitry is provided that ensures that a bit line reading switch, which may in embodiments take the form of read-pass-transistors, are not inhibited before a sense amplifier is enabled. Without such latching circuitry, it is possible that a sleep signal intended to deactivate certain sub-components for a next operation cycle could cutoff the bit line reading switch before the sense amplifier is enabled, isolating bit lines before the sense amplifier is able to output a result of a read operation. Such isolation could in some instances result in erroneous data output of the read operation in the current operation cycle.

FIG. 1 is a block diagram illustrating an example memory device 100 in accordance with various embodiments of the present disclosure. The memory device 100 is formed of numerous electrical components and includes a memory array 110 and a local control circuit 120, among many other components such as those described in more detail in FIG. 2. The memory array 110 includes a number of memory cells (also referred to as bit cells) that are configured to store information in the form of '0' or '1'. The process of storing information to the memory array 110 is known as "writing." The process of reading information stored on the memory array 110 is known as "reading." Reading and writing are example functions of the memory device 100. In order to perform these functions, some electrical components that make up the memory device 100 require power and need to be turned on. However, not all electrical components require power during these functions and can be turned off temporarily (e.g., placed into a sleep mode). The process of turning on or off certain electrical components within the memory device is known as power management. Power management of the memory device 100 occurs using a series of power management signals sent to the electrical components to tell them whether to turn on or off. Certain electrical components take some time to turn on or wake up when power has been turned off or minimized. In order for the functions such as reading and writing to run smoothly, power should be maintained to the components performing particular operations with minimal to no impact, while simultaneously turning on or off other electrical components.

Latch circuit 122 and delay 124 (e.g., first delay circuit) of local control circuit 120 can be used to assist with the power management signal operations and smoothing transitioning of turning on/off components within the memory device. Latch circuit 122 and delay 124 work together, as described in more detail in FIG. 3, to generate a power management signal, such as a sleep signal, to turn on/off specific electrical components without impacting the reading or writing functions of the memory device 100.

Figure 2:
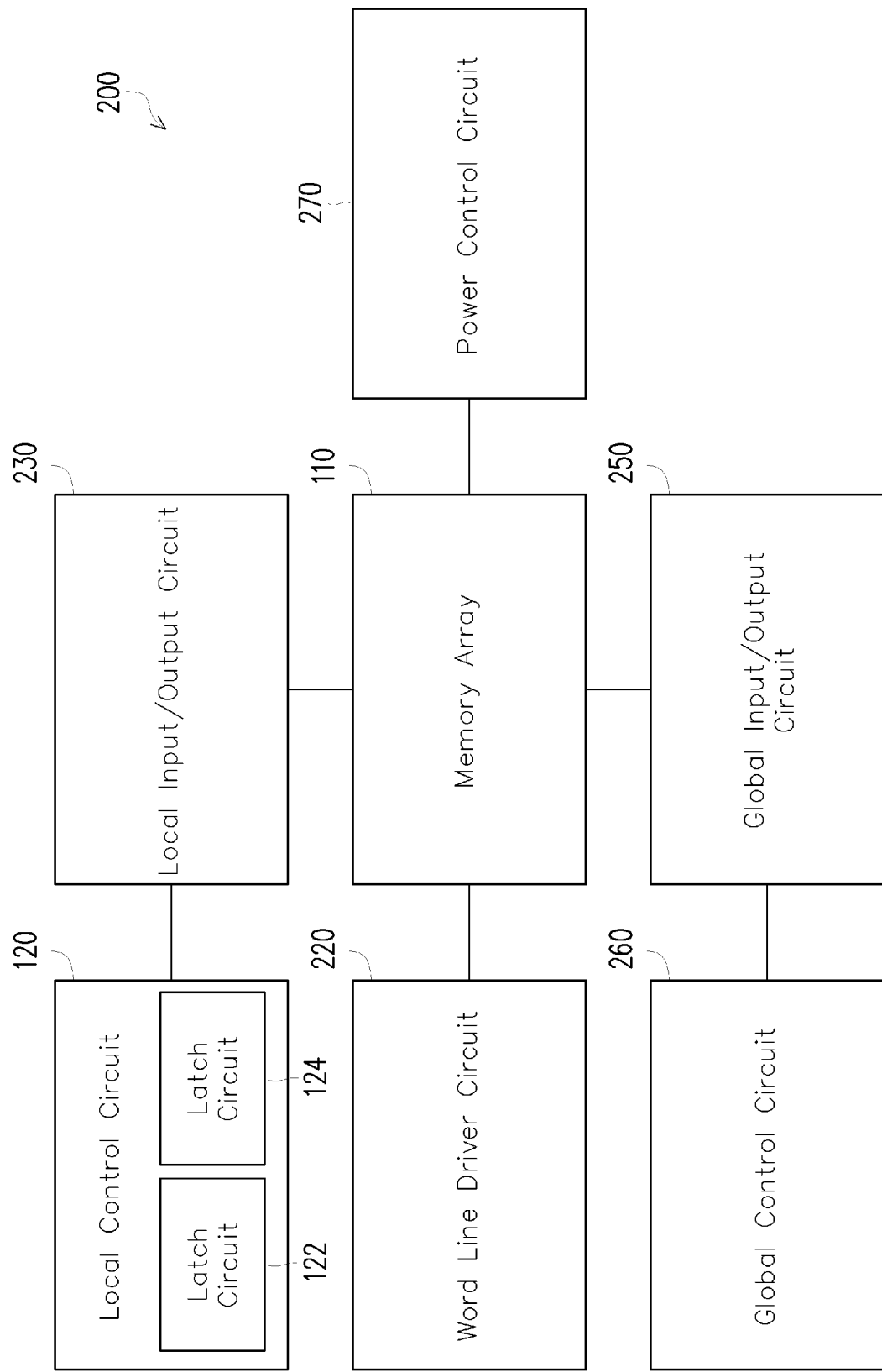
FIG. 2 is a block diagram illustrating another example memory device in accordance with various embodiments of the present disclosure.

FIG. 2 is a block diagram illustrating another example memory device 200 in accordance with various embodiments of the present disclosure. Like memory device 100, the memory device 200 can be a random access memory, such as a static random access memory (SRAM) device or another type of memory device such as a dynamic random access memory (DRAM) device. As shown in FIG. 2, the memory device 200 includes at least one memory array 110, as well as a plurality of peripheral circuits such as a word line (WL) driver circuit 220, a local input/output (IO) circuit 230, a local control circuit 120, a global IO circuit 250, a global control circuit 260, and a power control circuit or power controller 270. The memory device 200 may include other components not shown in FIG. 2. In example embodiments, the memory device 200 can be part of an integrated circuit (IC) chip.

The memory array 110 includes bit cells arranged in a matrix of rows and columns. Each of the memory cells of the memory array 110 is operative to store one bit of information. For example, in some SRAM implementations, each memory cell uses six transistors connected between an upper reference potential and a lower reference potential (typically ground) such that one of two storage nodes can be occupied by the information to be stored, with the complementary information stored at the other storage node.

The memory array 110 includes a plurality of word lines and a plurality of bit line pairs. Each memory cell of the memory array 110 is connected to a word line and a bit line pair. A word line is operative to activate access to the memory cells of a row connected to the word line. The bit line pair is used to access information stored or to be stored in the memory cells activated by the word line. Although the memory device 200 is shown to include only one memory array 110 for ease of discussion, the memory device 200 could include multiple memory arrays 110.

The peripheral devices include circuits that provide various functions of the memory device 200 associated with the memory array 110. For instance, the word line driver circuit 220 of the memory device 200 is operative to select a word line of the memory array 110 and charge the selected word line to a logic high. The logic high is approximately equal to a first predefined potential. In example embodiments, the word line driver circuit 220 is a decoder circuit that includes a plurality of logic operators to decode potentials on address lines to identify a word line to activate. The address lines are charged to logic high (that is, approximately equal to the first potential) or logic low (that is, approximately equal to a second potential). In example embodiments, the second predetermined potential is approximately equal to the ground potential or zero volts. The logic high is represented by bit 1 and the logic low is represented by bit 0.

The local IO circuit 230 of the memory device 200 is operative to read and write data from and into the memory array 110. For example, the local IO circuit 230 is operative to sense potentials at the plurality of bit line pairs and compare the potentials for each pair. In example embodiments, when the potential of a first bit line is more than the potential of a second bit line of a bit line pair, local IO circuit 230 reads the output to be logic 1. In addition, when the potential of a first bit line is less than the potential of the second bit line of the bit line pair, local IO circuit 230 reads the output to be logic 0.

The local control circuit 120 of the memory device 200 is operative to control the local IO circuit 230. For example, the local control circuit 120 is operative to configure the local IO circuit 230 in a read mode to read information from the memory array 110 or in a write mode to write information into the memory array 110. In addition, the local control circuit 120 is operative to enable the local IO circuit 230 in a hold mode where no data is read from or written into memory array 110.

The global IO circuit 250 of the memory device 200 is operative to combine input/output from the local IO circuits 230. For example, the memory device 200 may include multiple memory arrays 110 each having a respective local IO circuit 230. The global IO circuit 250 is operative to combine the information from multiple local IO circuits 230 into a global IO of the memory device 200. For example, local IO circuits 230 are operable to store output from the memory arrays 110 in a shift register, the global IO circuit 250 is operable to read the data from the shift register, and provide the data as the output of memory device 200.

The global control circuit 260 of the memory device 200 is operative to control the global IO circuit 250. For example, the global control circuit 260 is operative to configure the global IO circuit 250 to select one or more local IO circuits 230 to read data from or write data into. In another example, the global control circuit 260 is operative to configure a reading sequence for the global IO circuit 250 to read data from, or a writing sequence to write data into one or more local IO circuits 230.

The power control circuit 270 is operative to control and manage power for one or more components of the memory device 200. For example, the power control circuit 270 is operative to selectively connect one or more components of the memory device 200 to a voltage terminal in some embodiments. The power control circuit 270 includes a plurality of logic gates or power gates. Each of the plurality of power gates is operative to power up or power down an associated component of the memory device 200. The power gates are enabled by a signal. For example, a first signal enables a power gate to power up a component and a second signal enables the power gate to power down the component.

Figure 3:
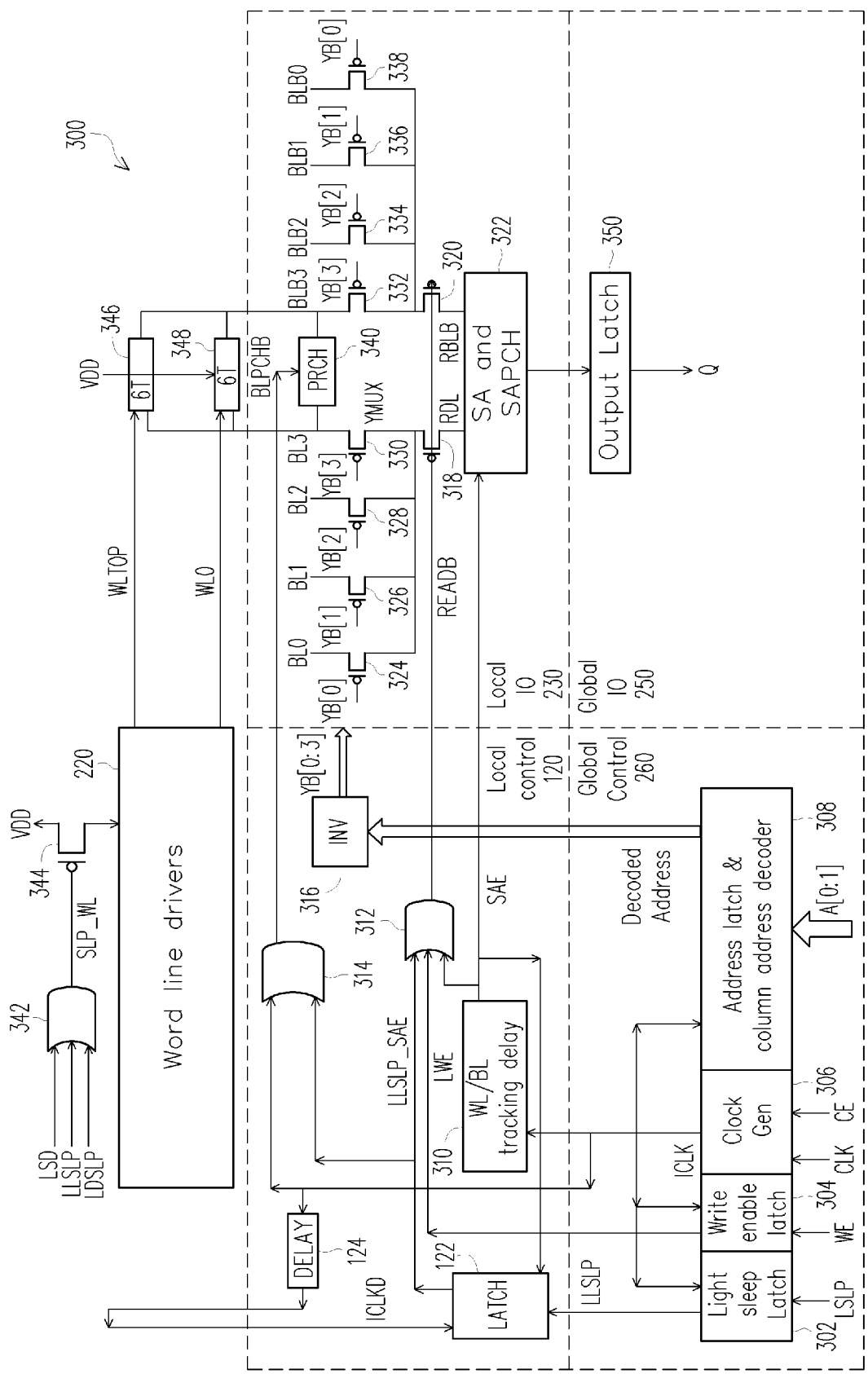
FIG. 3 is a block diagram illustrating an example memory device in accordance with various embodiments of the present disclosure.

FIG. 3 is a block diagram illustrating an example memory device 300 in accordance with various embodiments of the present disclosure. Memory device 300 illustrates further components that can be implemented in either memory device 100 of FIG. 1 or memory device 200 of FIG. 2. The memory device 300 is configured to receive a number of signals that facilitate operation including a light sleep signal (LSLP), a write enable signal (WE), a clock signal (CLK) and a clock enable signal (CE). Additionally, the memory device 300 receives an address signal. The global control circuit 260 includes a light sleep latch circuit 302, write enable latch circuit 304, a clock generator 306, and an address latch and column decoder component 308. The light sleep latch circuit 302 receives a light sleep signal (LSLP), a binary logic signal, from an external input. The light sleep latch circuit 302 generates a second light sleep signal (LLSLP) that is provided to the local control circuit 120. The second light sleep signal (LLSLP) is generated using two inputs: the light sleep signal (LSLP) and an internal clock signal (ICLK) generated by clock generator 306. When LSLP signal is a logic high (e.g., '1') and the internal clock signal (ICLK) transitions to a logic low (e.g., '0'), the output of the light sleep latch circuit 302 (e.g., second light sleep signal (LLSLP)) is a logic high (e.g., '1'). Further details on these signals are described in relation to the timing diagram 500 of FIG. 5.

The light sleep signal (LSLP) is the signal used to enable light sleep mode. When light sleep mode is enabled, all supply voltage to the word lines and bit lines within memory device 300 is turned off. More specifically, the write enable latch circuit 304 receives a write enable signal (WE) from an external input and the internal clock signal (ICLK) generated by the clock generator 306. The write enable latch circuit 304 generates a light write enable signal (LWE) based on these two inputs. For example, write enable latch circuit 304 outputs a light write enable signal (LWE) to the local control circuit 120 that is a logic high (e.g., '1') when the write enable signal (WE) is also a logic high (e.g., '1'). When the write enable signal is a logic high (e.g., '1'), memory device 300 performs a write operation. When the write enable signal (WE) is a logic low (e.g., '0'), the light write enable signal is also a logic low (e.g., '0') and the memory device 300 performs a read operation. The clock generator 306 receives both a clock signal (CLK) as well as a clock enable signal (CE). The clock enable signal (CE) drives operation of the memory device 300. When the clock enable signal (CE) is a logic high (e.g., 1'), memory device 300 is operational and the internal clock signal (ICLK) is generated. When the clock enable signal (CE) is a logic low (e.g., '0'), memory device 300 is not operational and the internal clock signal (ICLK) is not generated. The clock generator 306 outputs an internal clock signal (ICLK) to the local control circuit 120. The address latch and column address decoder 308 receives an address and outputs a decoded address to the local control circuit 120.

The local control circuit 120 includes latch circuit 122, delay 124, a word line/bit line tracking delay component 310, logic gates 312, 314, and an inverter 316. The local control circuit 120 receives the second light sleep signal (LLSLP), light write enable signal (LWE), internal clock signal (ICLK), and the decoded address from the global control circuit. More specifically, the latch circuit 122 receives the second light sleep signal (LLSLP). The latch circuit 122 generates a third light sleep signal (LLSLP_SAE) according to a sense amplifier enable signal (SAE) it receives from the output of the word line/bit line tracking delay component 310 that is feedback to latch circuit 122. More specifically, the sense amplifier enable signal (SAE) is generated by word line/bit line tracking delay component 310. When the memory device 300 switches from performing a read operation to a write operation, the sense amplifier enable signal (SAE) is a logic high (e.g., '1'). When the sense amplifier enable signal (SAE) goes high, the latch circuit 122 holds the previous value of the second light sleep signal (LLSLP). Alternatively, when the sense amplifier enable (SAE) signal is a logic low (e.g., '0'), the current value of the second light sleep signal (LLSLP) is output as the third light sleep signal (LLSLP_SAE). Further details on these signals are described in relation to the timing diagram 500 of FIG. 5.

The latch circuit 122 provides the third light sleep signal (LLSLP_SAE) to a logic gate 312. Logic gate 312 evaluates the presence of the third light sleep signal (LLSLP_SAE) and the light write enable signal (LWE). The logic gate 312 illustrated in FIG. 3 is a NAND gate. When both the third light sleep signal (LLSLP_SAE) and the light write enable signal (LWE) are logic lows (e.g., '0'), the output of the logic gate 312, a read bit signal (READB), is a logic high. When both the third light sleep signal (LLSLP_SAE) and the light write enable signal (LWE) are logic highs (e.g., '1'), the output of logic gate 312 is a logic low. The read bit signal (READB) couples to a bit line reading switch (e.g., transistors 318 RBL and transistors 320 RBLB) of the local input/output 230. Based on the read bit signal (READB), the bit line reading switch is cutoff after a sense amplifier 322 is enabled. For example, when the sense amplifier enable signal (SAE) is a logic high (e.g., '1'), after a time delay the read bit signal (READB) is also is a logic high (e.g., '1'). This occurs because of the comparison performed by the logic gate 312. The sense amplifier 322 outputs a data signal to an output latch circuit 350 of the global input/output circuit 250 based on a logical comparison (e.g., OR comparison) between the third light sleep signal (LLSLP_SAE), light write enable signal (LWE), and the sense amplifier enable signal (SAE).

Logic gate 314 evaluates for the presence of both the third sleep signal (LLSLP_SAE) and the internal clock signal (ICLK). In the example in FIG. 3, logic gate 314 is a NAND gate. When both the third light sleep signal (LLSLP_SAE) and the internal clock signals (ICLK) are logic lows (e.g., '0'), the output of the logic gate 314, a bit line precharge signal (BLPCH), is a logic high. When both the third light sleep signal (LLSLP_SAE) and the internal clock signal (ICLK) are logic highs (e.g., '1'), the output of logic gate 314 is a logic low. The bit line precharge signal (BLPCHB) drives the operation of the precharge circuit 340. When the memory device 300 is placed in light sleep mode using light sleep signal (LSLP), all bit lines are disconnected from their respective power sources. This occurs when the bit line precharge signal (BLPCH) is a logic low (e.g., '0').

The local input/output circuit 230 includes a plurality of transistors 324, 326, 328, 330, 332, 334, 336, 338, bit line reading switches 318, 320, a sense amplifier 322, and a precharge circuit 340. The transistors 324, 326, 328, 330, 332, 334, 338 receive an address input output from inverter 316. The inverter 316 inverts the decoded address received from the address latch and column address decoder circuit 308. Each transistor 324, 326, 328, 330, 332, 334, 338 is coupled to a bit line BL/BLB. The gates of transistor 324, 326, 328, 330, 332, 334, 338 are each coupled to the output of inverter 316 and receive an inverted version of a portion of the decoded address. For example, transistors 324, 338 receive an address portion for the bit line pair to which it is coupled (e.g., BL0/BLB0). Transistors 326, 336 receive an address portion receive an address portion for the bit line pair to which it is coupled (e.g., BL1/BLB1). Transistors 328, 334 receive an address portion for the bit line pair to which it is coupled (e.g., BL2/BLB2). Transistors 330, 332 receive an address portion for the bit line pair to which it is coupled (e.g., BL3/BLB3). When the address portion is a logic low (e.g., '0') to a gate of one or more of the transistors 324, 326, 328, 330, 332, 334, 338, the respective transistor is turned on. Alternatively, when the address portion is a logic high (e.g., '1') to a gate of one or more of the transistors 324, 326, 328, 330, 332, 334, 338, the respective transistor is turned off and the voltage coupled to the source/drain terminal of that transistors is passed through the transistor. This operation is explained in more detail in FIG. 10.

Power for the word line driver 220 is managed using logic gate 342. Logic gate 342 generates a word line sleep signal (SLP_WL) based on the inputs light sleep delay signal (LSD), second light sleep signal (LLSLP) output from the light sleep latch circuit 302, and light sleep delay signal (LDSLP). The word line sleep signal (SLP_WL) is provided to a gate terminal of the transistor 344. When transistor 344 is closed, a driving voltage, VDD, is provided to the word line driver 220. The word line driver 220 operates the 6T SRAM cells 346, 348. WLTOP in FIG. 3 represents the top row of memory cells within memory device 300. WL0 in FIG. 3 represents the first row of memory cells within memory device 300. In order to enable the word lines within memory device 300, the complementary bit line pair BL3/BLB3 should be turned off. This occurs when the address portion is a logic high (e.g., '1'). This in turn discharges the read bit line pair (e.g., RBL/RBLB) and results in the 6T SRAM cells 346, 348 storing a logic high (e.g., '1').

Figure 4:
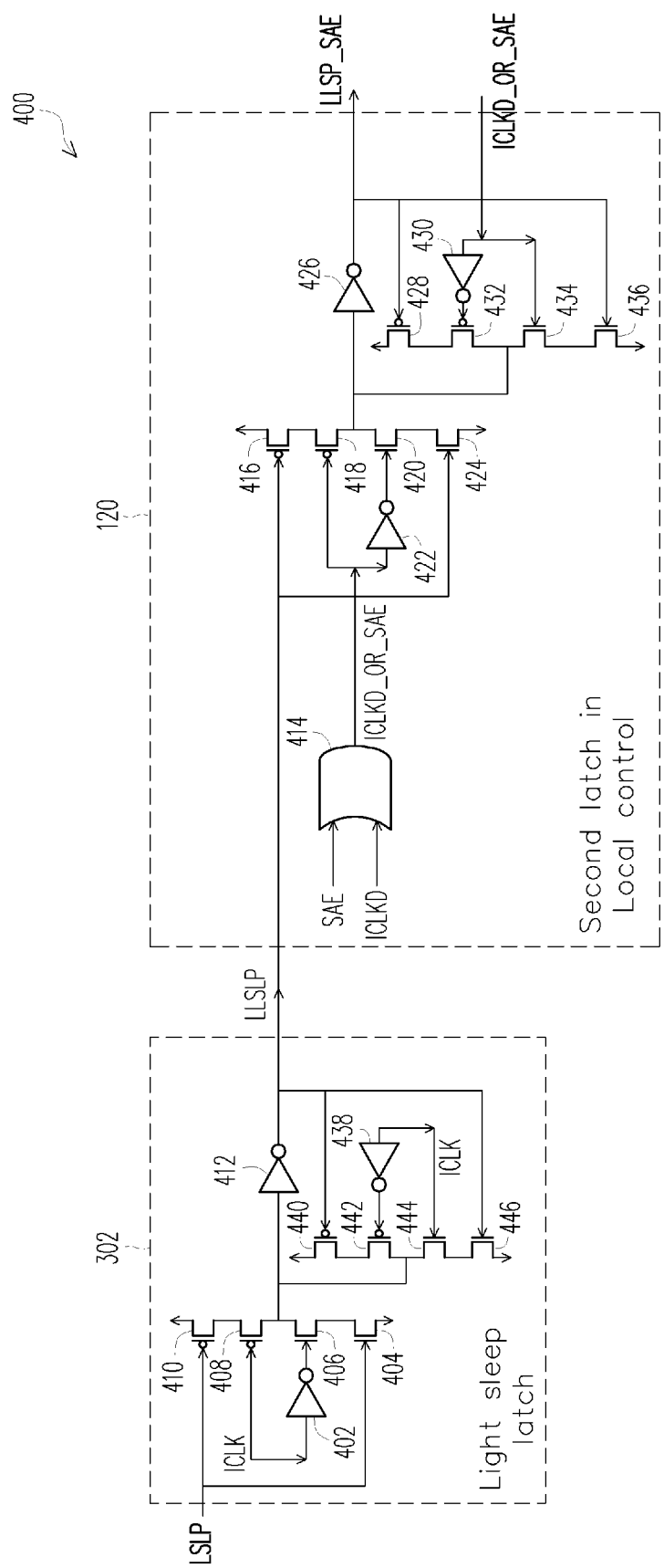
FIG. 4 is a circuit schematic illustrating an example light sleep latch circuit coupled to the latch circuit.

FIG. 4 is a circuit schematic illustrating an example light sleep latch circuit 302 coupled to the latch circuit 120. The light sleep latch circuit 302 includes inverters 402, 412, 438 and a plurality of transistors 404, 406, 408, 410, 440, 442, 444, 446. The light sleep latch circuit 302 receives a light sleep signal (LSLP) that drives PMOS transistor 410 and NMOS transistor 404. Light sleep latch circuit 302 outputs a second light sleep signal (LLSLP) to the latch circuit 122 of local control circuit 120. Latch circuit 122 includes a logic gate 414 that evaluates the sense amplifier enable signal (SAE) and the delayed internal clock signal (ICLKD) and outputs a signal (e.g., ICLKD_OR_SAE) based on the logical comparison. When either the sense amplifier enable signal (SAE) or the delayed internal clock signal (ICLKD) is a logic high (e.g., '1'), the output signal (e.g., ICLKD_OR_SAE) is a logic high (e.g., '1'). When both the sense amplifier enable signal (SAE) or the delayed internal clock signal (ICLKD) are logic lows (e.g., '0'), the output signal (e.g., ICLKD_OR_SAE) of logic gate 414 is a logic low (e.g., '0'). Latch circuit 122 also includes a plurality of inverters 422, 426, 430 and a plurality of transistors 416, 418, 420, 424, 428, 432, 434, and 436. Gate terminals of transistor 416 and transistor 424 each receive the second light sleep signal (LLSLP). When the second light sleep signal (LLSLP) is a logic high (e.g., '1'), transistor 416 is off and transistor 424 is operational. Alternatively, when the second light sleep signal (LLSLP) is a logic low (e.g., '0'), transistor 424 is off and transistor 416 is operational. The gate terminal of transistor 418 receives an output signal (e.g., ICLKD_OR_SAE) of logic gate 414. The gate terminal of transistor 420 is coupled to an output of inverter 422. Inverter 422 inverts the output of logic gate 414 (e.g., ICLKD_OR_SAE). When the output of the logic gate 414 (e.g., ICLKD_OR_SAE) is a logic high (e.g., '1'), transistors 418, 420 are off. When the output of the logic gate 414 (e.g., ICLKD_OR_SAE) is a logic low (e.g., '0'), transistors 418, 420 are operational. Transistors 428, 432, 434, 436 operate in a similar fashion. Inverter 426 outputs a third light sleep signal (LLSLP_SAE) that delays an activation signal (e.g., READB) to a read switch (e.g., transistors 318, 320) positioned between bit lines of a memory 300 and a sense amplifier 322 such that the sense amplifier enable signal (SAE) precedes the read switch activation signal (READB).

Figure 5:
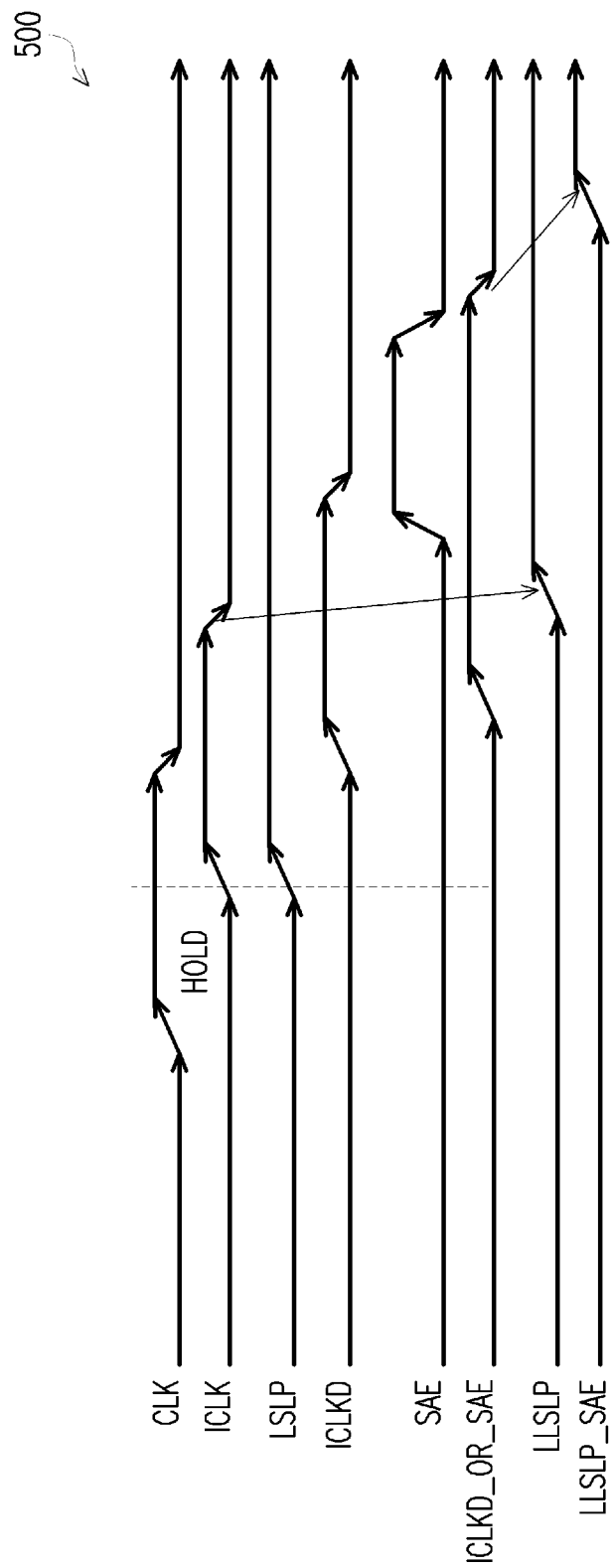
FIG. 5 is an example timing diagram illustrating various waveforms associated with the memory device of FIG. 3 in accordance with various embodiments of the present disclosure.

FIG. 5 is an example timing diagram 500 illustrating various waveforms associated with the memory device 300 of FIG. 3 in accordance with various embodiments of the present disclosure. As illustrated in FIG. 5, LLSLP is latched by the latch circuit 122 using the internal clock signal (ICLK) and sense amplifier enable signal (SAE) to generate third sleep signal (LLSLP_SAE). As previously explained in FIG. 3, The latch circuit 122 generates a third light sleep signal (LLSLP_SAE) according to a sense amplifier enable signal (SAE) it receives from the output of the word line/bit line tracking delay component 310 that is feedback to latch circuit 122. More specifically, the sense amplifier enable signal (SAE) is generated by word line/bit line tracking delay component 310. When the memory device 300 switches from performing a read operation to a write operation, the sense amplifier enable signal (SAE) is a logic high (e.g., '1'). When the sense amplifier enable signal (SAE) goes high, the latch circuit 122 holds the previous value of the second light sleep signal (LLSLP). Alternatively, when the sense amplifier enable (SAE) signal is a logic low (e.g., '0'), the current value of the second light sleep signal (LLSLP) is output as the third light sleep signal (LLSLP_SAE). As such, the third sleep signal (LLSLP_SAE) is raised to a logic high (e.g., '1') after the sense amplifier enable signal (SAE) is raised to a logic high (e.g., '1'). The bit line read signal (READB) is controlled by third light sleep signal (LLSLP_SAE). Logic gate 312 evaluates the presence of the third light sleep signal (LLSLP_SAE) and the light write enable signal (LWE). The logic gate 312 illustrated in FIG. 3 is a NAND gate. When both the third light sleep signal (LLSLP_SAE) and the light write enable signal (LWE) are logic lows (e.g., '0'), the output of the logic gate 312, a read bit signal (READB), is a logic high. When both the third light sleep signal (LLSLP_SAE) and the light write enable signal (LWE) are logic highs (e.g., '1'), the output of logic gate 312 is a logic low. As such, the bit line read signal (READB) is also raised to a logic high (e.g., '1') after the sense amplifier enable (SAE) is raise to a logic high (e.g., '1'), which ensures the sense amplifier 322 is enabled before their inputs are disconnected from the bit lines BL/BLB. Therefore, voltages on bit lines BL and BLB has sufficient time to be discharged, and Q outputted by the sense amplifier 322 is accurate.

Figure 6:
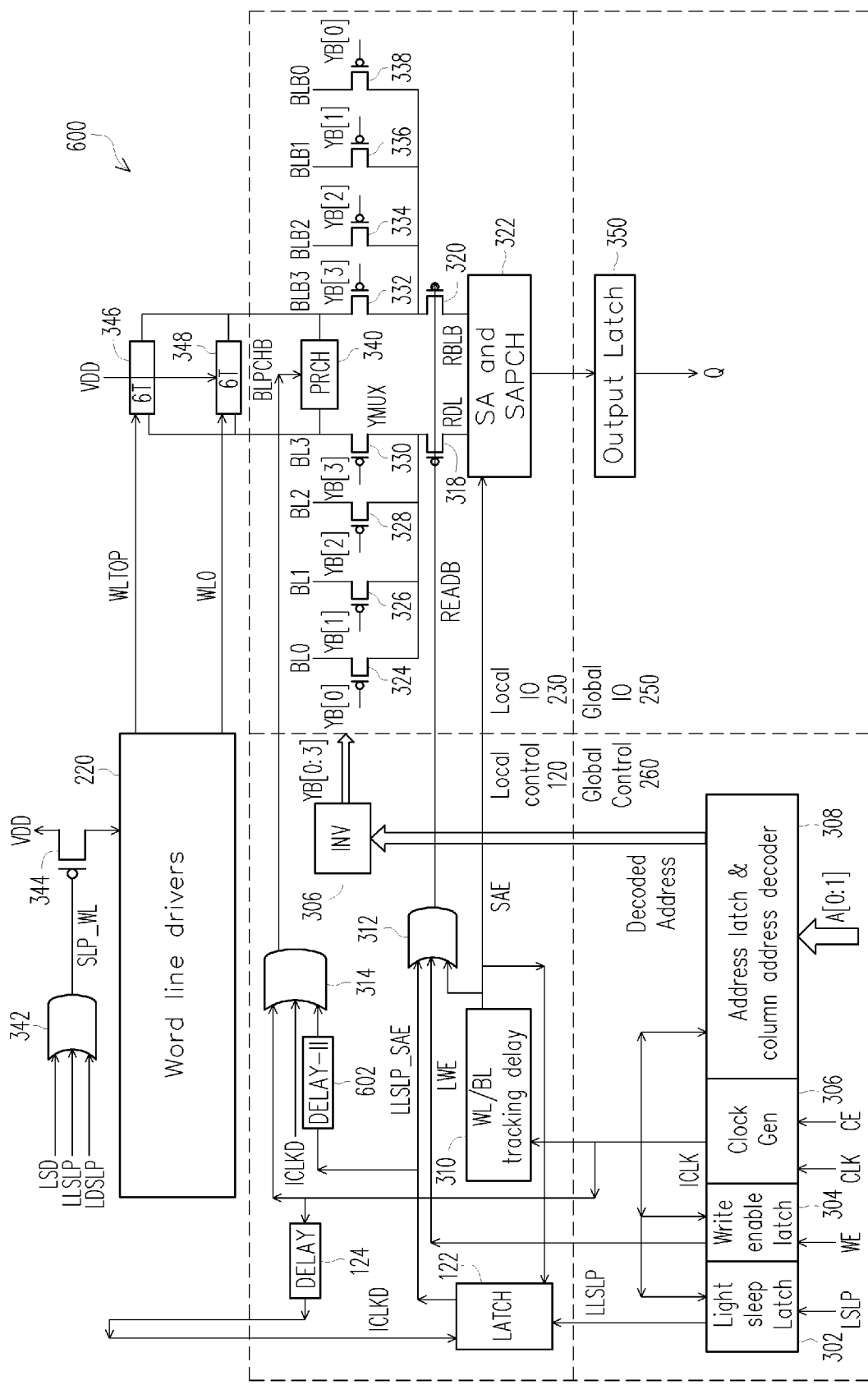
FIG. 6 is a block diagram illustrating an example memory device in accordance with various embodiments of the present disclosure.

FIG. 6 is a block diagram illustrating an example memory device 600 in accordance with various embodiments of the present disclosure. The components of FIG. 6 are similar to those described in FIG. 3. The memory device 600 of FIG. 6 differs from memory device 300 of FIG. 3 in that it includes an additional delay component 602. Delay component 602 is coupled between latch circuit 122 and logic gate 314. Delay component 602 delays the third light sleep signal generated by latch circuit 122. In some cases, a race condition exists between the read bit line signal (READB) and the bit line precharge signal (BLPCHB). In order for memory device 600 to operate in light sleep mode, the read bit line signal (READB) must go to a logic high (e.g. '1') before the bit line precharge signal (BLPCHB). Delay component 602 injects a delay to the third light sleep signal (LLSLP_SAE) so that the output of logic gate 314 (e.g., the BLPCHB) is delayed in time and the read bit line signal (READB) output from logic gate 312 goes to a logic high (e.g., '1') faster. All other operations of memory device 300 previously described apply to the memory device 600.

Figure 7:
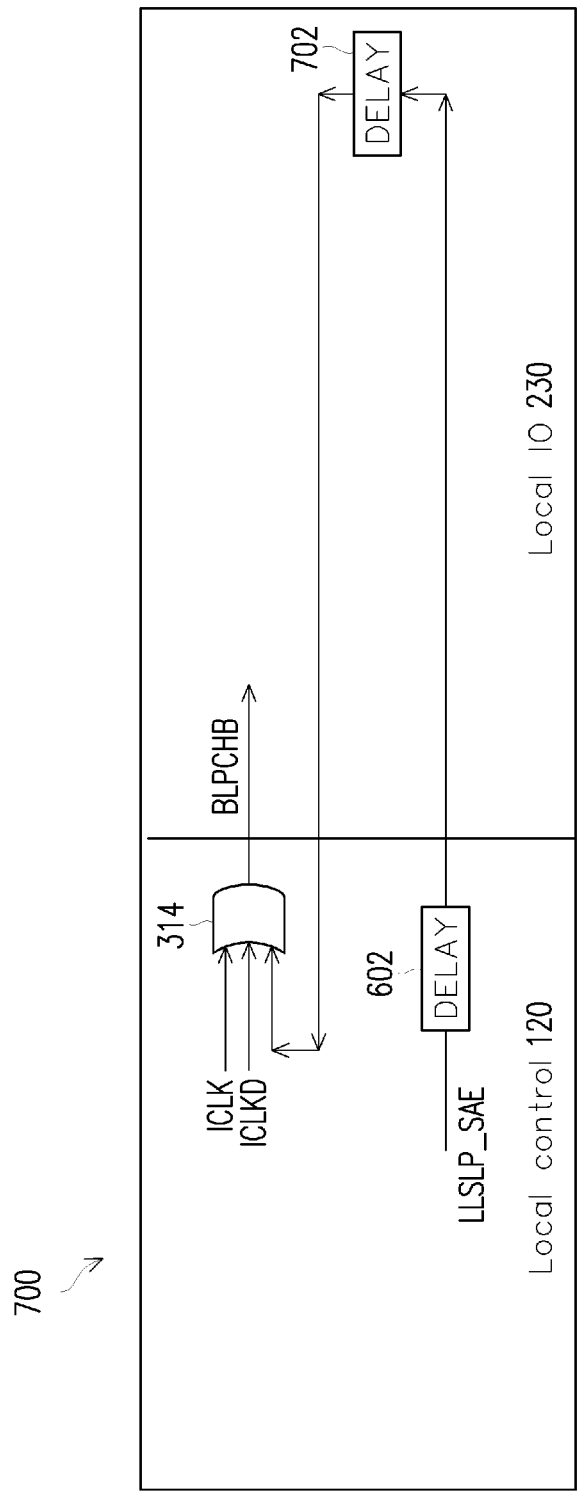
FIG. 7 is a block diagram illustrating an example delay configuration in accordance with various embodiments of the present disclosure.

FIG. 7 is a block diagram illustrating an example delay configuration 700 in accordance with various embodiments of the present disclosure. As illustrated in FIG. 7, an additional delay component 602 is placed within the local control circuit 120. Delay component 602 further delays the signal going to delay component 702 of local input/output circuit 230. Delay component 602 delays the third light sleep signal generated by latch circuit 122. In some cases, a race condition exists between the read bit line signal (READB) and the bit line precharge signal (BLPCHB). In order for memory device 600 to operate in light sleep mode, the read bit line signal (READB) must go to a logic high (e.g. '1') before the bit line precharge signal (BLPCHB). More specifically, delay component 602 injects a delay to the third light sleep signal (LLSLP_SAE) so that the output of logic gate 314 (e.g., the BLPCHB) is delayed in time and the read bit line signal (READB) output from logic gate 312 goes to a logic high (e.g., '1') faster. The configuration illustrated in FIG. 7 is an RC loop with delays (e.g., a series of buffers). Delay 702 injects an additional time delay to further delay the output of logic gate 314 (e.g., bit line precharge signal (BLPCHB)).

Figure 8:
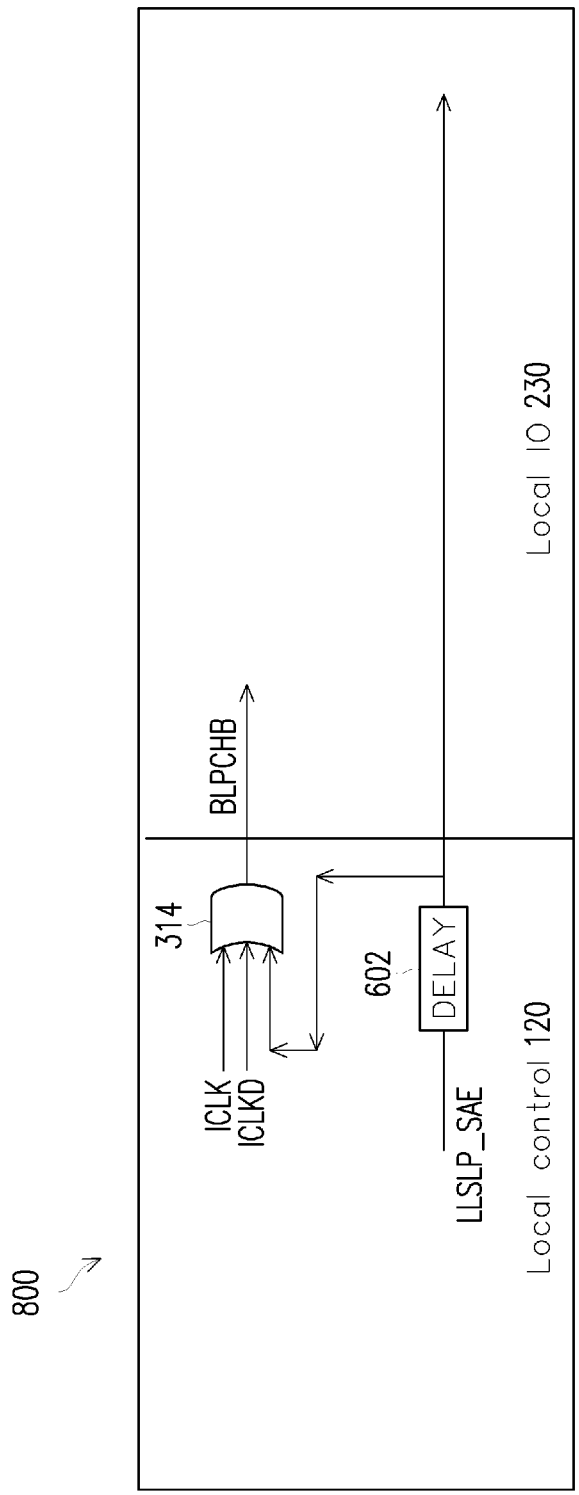
FIG. 8 is a block diagram illustrating another example delay configuration in accordance with various embodiments of the present disclosure.

FIG. 8 is a block diagram illustrating another example delay configuration 800 in accordance with various embodiments of the present disclosure. The delay configuration 800 is similar to the delay configuration of FIG. 7. Delay component 602 delays the third light sleep signal generated by latch circuit 122. In some cases, a race condition exists between the read bit line signal (READB) and the bit line precharge signal (BLPCHB). In order for memory device 600 to operate in light sleep mode, the read bit line signal (READB) must go to a logic high (e.g. '1') before the bit line precharge signal (BLPCHB). Delay component 602 injects a delay to the third light sleep signal (LLSLP_SAE) so that the output of logic gate 314 (e.g., the BLPCHB) is delayed in time and the read bit line signal (READB) output from logic gate 312 goes to a logic high (e.g., '1') faster. Delay configuration differs in that there are no additional delay components in the local input/output circuit 230 in FIG. 8.

Figure 9:
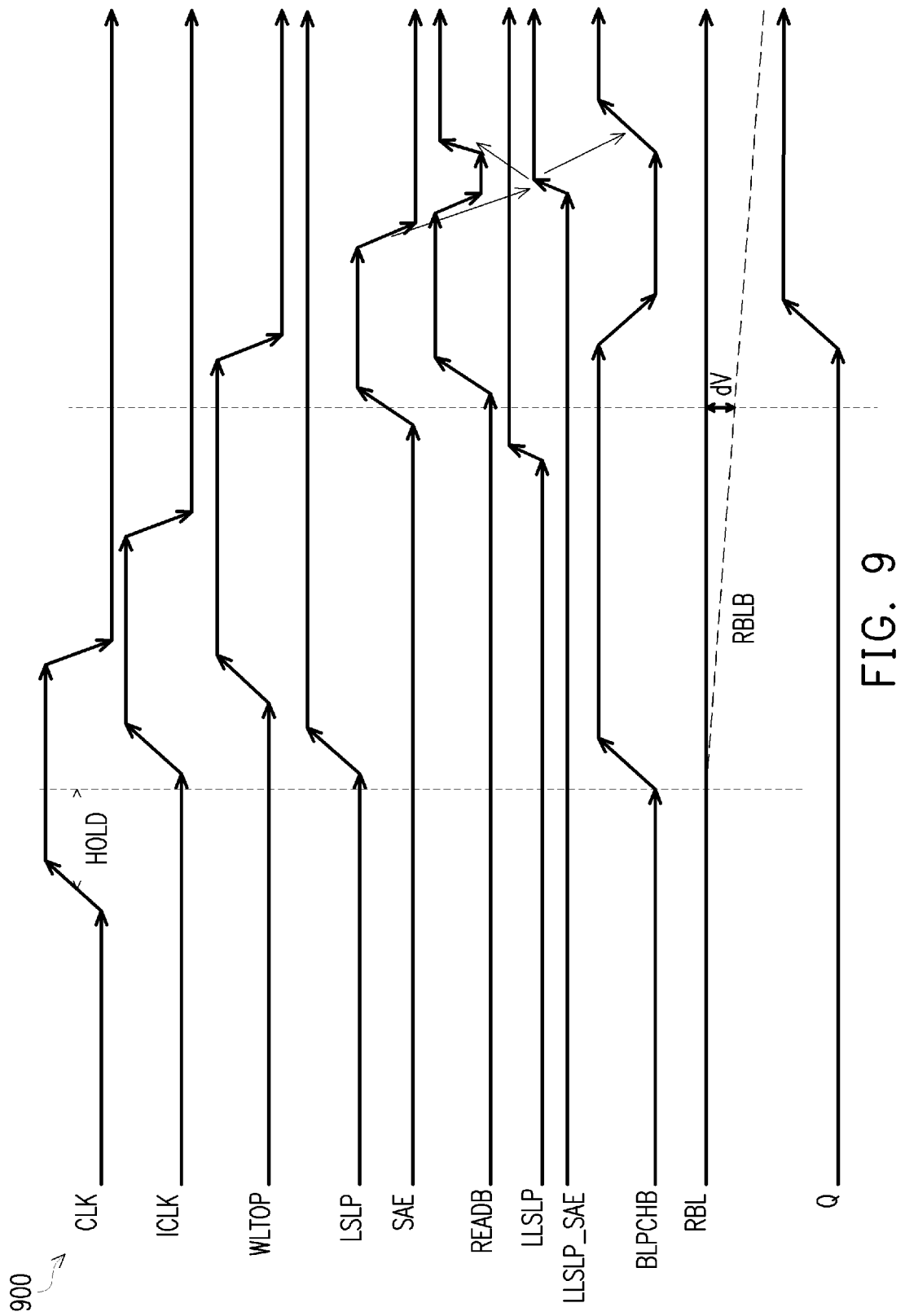
FIG. 9 is an example timing diagram illustrating various waveforms associated with the memory device 600 of FIG. 6 in accordance with various embodiments of the present disclosure.

FIG. 9 is an example timing diagram 900 illustrating various waveforms associated with the memory device 600 of FIG. 6 in accordance with various embodiments of the present disclosure. The timing diagram 900 has similar features to those previously discussed in FIG. 5. With the additional delay component 602, the third sleep signal (LLSLP_SAE) is delayed in time even more so than what is illustrated in the timing diagram 500 of FIG. 5.

Figure 10:
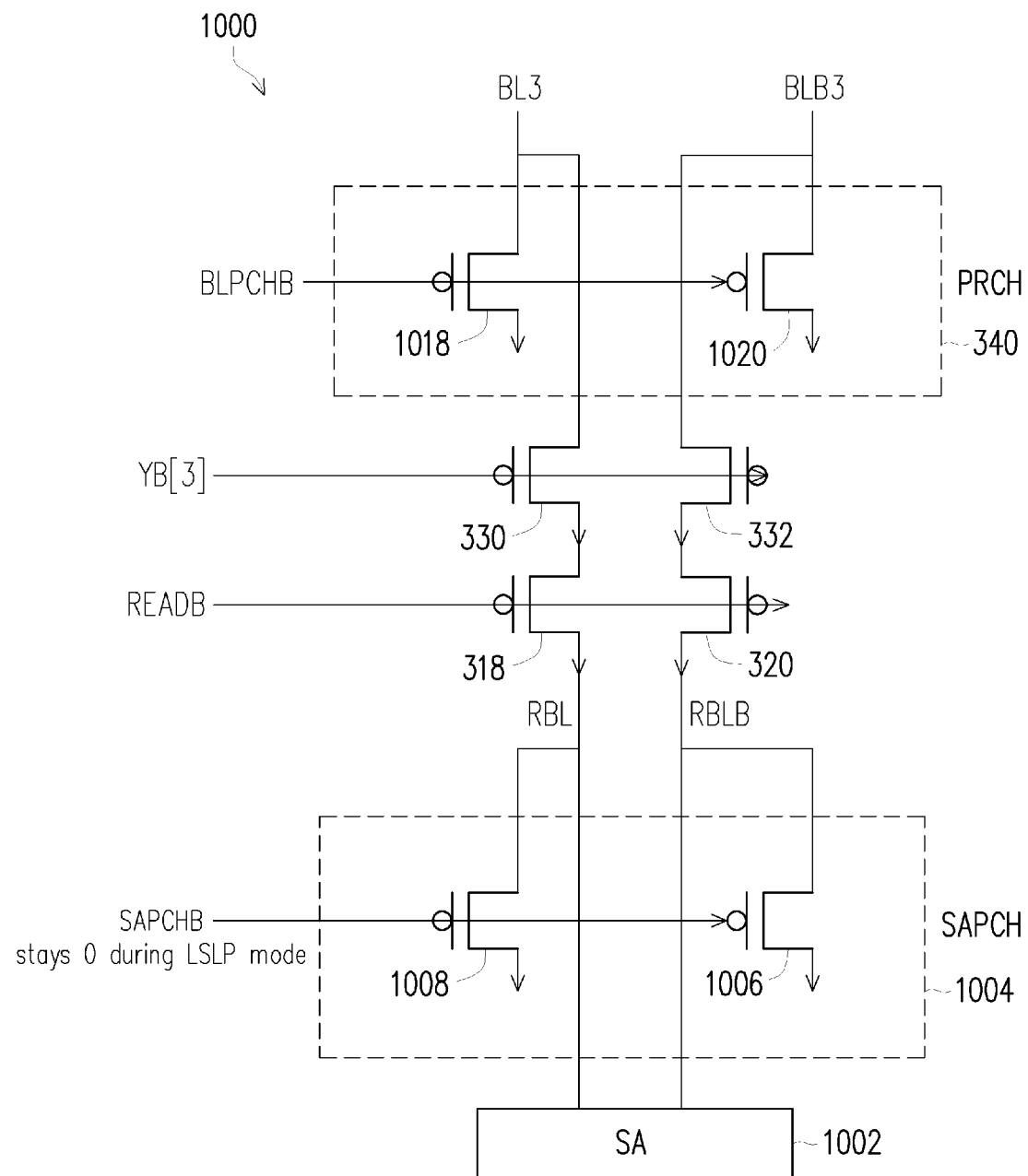
FIG. 10 is a circuit schematic illustrating another example delay configuration in accordance with various embodiments of the present disclosure.

FIG. 10 is a circuit schematic 1000 illustrating another example time delay configuration in accordance with various embodiments of the present disclosure. As illustrated in FIG. 10, the precharge circuit 340 includes a pair of transistors 1018, 1020 coupled to a pair of bit lines BL/BLB. The pair of transistors 1018, 1020 is coupled to transistors 330, 332 described in FIG. 3. Transistors 330, 332 are coupled to the read transistors 318, 320. Read transistors 318, 320 are coupled to a sense amplifier precharge circuit 1004, which in turn is coupled to the sense amplifier 1002. In this example, a second delay circuit (e.g., delay 602) is also applied to bit line precharge (BLPCHB). The second delay circuit (e.g., delay 602) injects a time delay to delay the output of logic gate 314. Therefore, after third sleep signal (LLSLP_SAE) goes to a logic high (e.g., '1'), the read bit line (READB) goes to a logic high (e.g., '1') first before the bit line precharge (BLPCHB) goes to a logic high (e.g., '1'). In some cases, this can avoid bit line pair, BL and BLB, to be pre-charged from the SA pre-charge circuit (SAPCHB) 1004. In other words, the read bit line (READB) goes to a logic high before the bit line precharge (BLPCHB) goes to a logic high, so the bit line pairs BL and BLB are disconnected from the sense amplifier circuit 1002 first.

Circuit schematic includes transistors 1018, 1020. When memory device 300, 600 is dormant (e.g., no read/write operations), the bit line precharge signal (BLPCHB) is a low logic (e.g., 0). With the bit line precharge signal (BLPCHB) at a logic low (e.g., '0'), the transistors 1018 are operational and the BL3, BLB3 is precharged to a supply voltage coupled to the source/drain terminals of transistors 1018, 1020. When a read/write operation is occurring in the memory device 300, 600, the bit line precharge signal (BLPCHB) is a logic high (e.g., '1'). When the bit line precharge signal (BLPCHB) is a logic high (e.g., '1'), the transistors 1018, 102 are off and whatever voltage is on BL3/BLB3 will be passed to transistors 330, 332. If the column YB[3] is selected in the memory device 300, 600 using a portion of the decoded address, then the gate input of transistors 330, 332 is a logic low (e.g., '0'). When the gate input of transistors 330, 332 is a logic low (e.g., '0'), then the transistors 330, 332 are operational. With transistors 330, 332 operational, whatever voltage that is on the bit line propagates to read bit line pair (RBL/RBLB). Additionally, when the memory device 300, 600 is placed into light sleep mode, the bit line precharge signal (BLBCHB) is a logic high (e.g., '1') so that the bit lines are disconnected from its respective power source.

Figure 11:
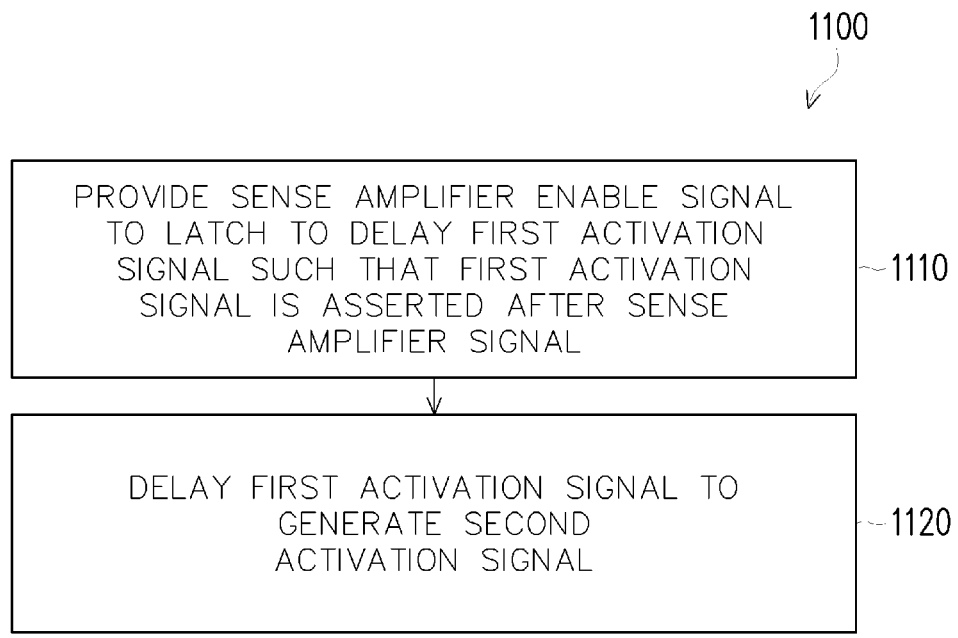
FIG. 11 is a process flow diagram illustrating method of controlling a bit line precharge circuit.

FIG. 11 is a process flow diagram 1100 illustrating method of controlling a bit line precharge circuit. While FIG. 11 is described here with reference to previously described structures for ease in understanding, it is understood that the method applies to many other structures as well. A sense amplifier enable signal (SAE) is provided to a latch circuit (e.g., latch circuit 122) to delay a first activation signal (e.g., bit line precharge signal (BLPCHB)) such that the first activation signal is asserted after the sense amplifier signal (e.g., step 1110). The first activation signal is provided to a read switch (e.g., transistors 318, 320). The first activation signal is delayed to generate a second activation signal (e.g., step 1120). The second activation activates the bit line precharge circuit only after the first activation signal is provided to the read switch (e.g., transistors 318, 320). This in turn allows for the word lines and bit lines to be turned off during light sleep mode, such that they are disconnected their respective power sources and the overall leakage current of the memory device 300, 600 is minimized.

Use of the various circuits and methods as described herein can provide a number of advantages. For example, introduction of the latch circuit within the local control circuit facilitates various memory device operations such as mission, DFT and pipeline to be performed without a timing impact due to power management assertion in the same cycle. Additionally, introduction of the latch circuit has minimal impact (e.g., ~1%) to the memory device.

In one embodiment, a control circuit includes a first latch circuit and a second latch circuit. The first latch circuit is configured to receive a first light sleep signal. The first latch circuit generates a second light sleep signal according to a clock signal. The second latch circuit is configured to receive the second light sleep signal. The second latch circuit generates a third light sleep signal according to a sense amplifier enable signal. The second latch circuit provides the third light sleep signal to a bit line reading switch, so the bit line reading switch is cutoff after a sense amplifier is enabled.

In another embodiment, a read switch driving circuit includes a latch circuit. The latch circuit is configured to receive a sleep signal and a sense amplifier enable signal. The latch circuit is also configured to delay an activation signal to a read switch positioned between bit lines of a memory and a sense amplifier such that the sense amplifier enable signal precedes the read switch activation signal.

In yet another embodiment, a method of controlling a bit line precharge circuit includes providing a sense amplifier enable signal to a latch to delay a first activation signal such that the first activation signal is asserted after the sense amplifier signal. The first activation signal is provided to a read switch. The method also includes delaying the first activation signal to generate a second activation signal. The second activation activates the bit line precharge circuit only after the first activation signal is provided to the read switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A control circuit comprising:
   a latch circuit configured to generate a first light sleep signal according to a sense amplifier enable signal and to provide the first light sleep signal to a bit line reading switch so the bit line reading switch is cutoff after a sense amplifier is enabled, wherein the latch circuit comprises a logic gate configured to compare the sense amplifier enable signal and a clock signal.

2. The control circuit of claim 1, wherein the latch circuit is configured to modify power to a memory device coupled thereto without interrupting read operations or write operations of the memory device.

3. The control circuit of claim 2, wherein the memory device comprises a plurality of peripheral circuits including a local input/output circuit, a global input/output circuit, a local input/output controller, and a global input output controller.

4. The control circuit of claim 1, wherein the latch circuit further comprises:
   a first inverter coupled to an output of the logic gate and configured to invert the output;
   a set of transistors coupled to an output of the first inverter and configured to send a second light sleep signal; and
   a second inverter coupled to an output of the set of transistors and configured to output the first light sleep signal by inverting the second light sleep signal.

5. The control circuit of claim 4, wherein the set of transistors comprise at least four transistors coupled in series and the at least four transistors comprise two transistors of a first type and two transistors of a second type.

6. The control circuit of claim 1, further comprising a set of transistors that comprise at least four transistors coupled in series, the at least four transistors comprising two transistors of a first type and two transistors of a second type, the set of transistors being configured to receive a clock signal or the sense amplifier enable signal.

7. A read switch driving circuit comprising:
   a latch circuit configured to receive a sense amplifier enable signal and to delay an activation signal to a read switch positioned between bit lines of a memory and a sense amplifier such that the sense amplifier enable signal precedes the activation signal, wherein the latch circuit comprises a logic gate configured to compare the sense amplifier enable signal and a clock signal.

8. The read switch driving circuit of claim 7, wherein the latch circuit is configured to modify power to a memory device coupled thereto without interrupting read operations or write operations of the memory device.

9. The read switch driving circuit of claim 8, wherein the memory device comprises a plurality of peripheral circuits including a local input/output circuit, a global input/output circuit, a local input/output controller, and a global input output controller.

10. The read switch driving circuit of claim 7, wherein the latch circuit further comprises:
    a first inverter coupled to an output of the logic gate and configured to invert the output;
    a set of transistors coupled to an output of the first inverter and configured to send a light sleep signal; and
    a second inverter coupled to an output of the set of transistors and configured to output the activation signal by inverting the light sleep signal.

11. The read switch driving circuit of claim 10, wherein the set of transistors comprise at least four transistors coupled in series and the at least four transistors comprise two transistors of a first type and two transistors of a second type.

12. The read switch driving circuit of claim 7, further comprising a set of transistors that comprise at least four transistors coupled in series, the at least four transistors comprising two transistors of a first type and two transistors of a second type, the set of transistors being configured to receive a clock signal or the sense amplifier enable signal.

13. A method of controlling a bit line precharge circuit, comprising:
providing a sense amplifier enable signal to a latch circuit to delay an activation signal such that the activation signal is asserted after the sense amplifier enable signal, wherein the activation signal is provided to a read switch, wherein the latch circuit comprises a logic gate configured to compare the sense amplifier enable signal and a clock signal.

14. The method of claim 13, wherein the activation signal is delayed using a delayed component.

15. The method of claim 13, wherein the latch circuit is configured to modify power to a memory device coupled thereto without interrupting read operations or write operations of the memory device.

16. The method of claim 15, wherein the memory device comprises a plurality of peripheral circuits including a local input/output circuit, a global input/output circuit, a local input/output controller, and a global input output controller.

17. The method of claim 16, further comprising operating the memory device in a power management mode including removing power from a portion of the peripheral circuits.

18. The method of claim 13, wherein the latch circuit further comprises:
a first inverter coupled to an output of the logic gate and configured to invert the output;
a set of transistors coupled to an output of the first inverter and configured to send a light sleep signal; and
a second inverter coupled to an output of the set of transistors and configured to output the activation signal by inverting the light sleep signal.

19. The method of claim 18, wherein the set of transistors comprise at least four transistors coupled in series, the at least four transistors comprising two transistors of a first type and two transistors of a second type.

20. The method of claim 13, further comprising a set of transistors that comprises at least four transistors coupled in series, the at least four transistors comprising two transistors of a first type and two transistors of a second type, the set of transistors configured to receive a clock signal or the sense amplifier enable signal.

* * * * *